(12) United States Patent
Chan et al.

(10) Patent No.: US 8,451,617 B2
(45) Date of Patent: May 28, 2013

(54) INTEGRATED CIRCUIT BOARD

(75) Inventors: Chun-Kong Chan, Taipei County (TW); Chi Ching Chen, Taipei County (TW)

(73) Assignee: Lien Chang Electronic Enterprise Co., Ltd., Taipei County (TW)

( * ) Notice: Subject to any disclaimer, the term of this patent is extended or adjusted under 35 U.S.C. 154(b) by 347 days.

(21) Appl. No.: 12/847,276

(22) Filed: Jul. 30, 2010

(65) Prior Publication Data

US 2012/0026698 A1   Feb. 2, 2012

(51) Int. Cl.
*H05K 1/18* (2006.01)
*H05K 3/30* (2006.01)
*H05K 1/02* (2006.01)

(52) U.S. Cl.
CPC *H05K 1/18* (2013.01); *H05K 3/308* (2013.01); *H05K 1/0231* (2013.01)
USPC .......................................... 361/763; 361/766

(58) Field of Classification Search
CPC ......... H05K 1/18; H05K 3/308; H05K 1/0231; H05K 3/3447; H05K 2201/10462; H05K 2201/10757; H05K 2201/2018
USPC .................. 361/520, 508–513, 763, 766, 821
See application file for complete search history.

(56) References Cited

U.S. PATENT DOCUMENTS

| 6,310,764 | B1 * | 10/2001 | Will et al. ...................... 361/513 |
| 6,552,912 | B1 * | 4/2003 | Kanazawa et al. ............ 361/752 |
| 6,555,746 | B2 * | 4/2003 | Boyd et al. ....................... 174/50 |
| 2009/0155684 | A1 * | 6/2009 | Jang et al. ..................... 429/178 |
| 2010/0267252 | A1 * | 10/2010 | Fujimoto ......................... 439/55 |

* cited by examiner

*Primary Examiner* — Yuriy Semenenko
(74) *Attorney, Agent, or Firm* — Rosenberg, Klein & Lee

(57) ABSTRACT

An integrated circuit board includes a bridging filtering capacitor, a bypass capacitor, a thermistor, and a varistor. The integrated circuit board further includes an electrolytic capacitor set having a plurality of electrolytic capacitors, which are arranged in parallel and adjacent to each other, and a mounting frame for grouping the electrolytic capacitors. The present invention uses the above elements to reduce the vertical height, the horizontal width, and the occupied area. Therefore, the overall dimension of the circuit board can be reduced to make the electronic devices smaller, especially for thin electronic devices such as LCD TVs and screens.

6 Claims, 5 Drawing Sheets

INTEGRATED CIRCUIT BOARD

BACKGROUND OF THE INVENTION

1. Field of the Invention

The present invention relates to an integrated circuit board; in particular, to a circuit board that its height and dimension are reduced, especially for thin electronic devices, such as LCD TVs and screens.

2. Description of Related Art

Electronic devices are becoming smaller. As a key element, the circuit board occupies much space of the electronic device. Therefore, how to reduce the size of the circuit board, for reducing the usage of raw materials, is a key point for the development of green technology. Especially for LCD TVs and screens, the size of the circuit board is critical for the appearance of the display.

Reference is made to FIGS. 1A to 1E, which show the perspective views of the components used on the circuit board of the prior art. FIG. 1A shows the perspective view of the bridging filtering capacitor of the prior art. The bridging filtering capacitor is also called X capacitor, or X-CAP. In the EMI filtering circuit, the X-CAP is used for bridging the live line (L) and the neutral line (N) to dampen the low pass noise from the power line. The X-CAP 10a has a long cubic main body 11a, and a pair of electric leads 12a. The pair of electric leads 12a extends outwards from one side surface 111a of the main body 11a, and then bends downwards to be soldered onto the circuit board (not shown in the figure). The drawback is that the main body 11a and the pair of bent electric leads 12a occupy a large area of the circuit board (not shown in the figure) along the horizontal direction.

Reference is made to FIG. 1B, which shows the perspective view of the bypass capacitor of the prior art. The bypass capacitor is also called Y capacitor, or Y-CAP, for bridging the float grounding (FG) and the live line (L)/neutral line (N) to dampen the high pass and the common mode noise. The bypass capacitor 20a has a disc-shaped main body 21a, and a pair of electric leads 22a that extends outwards from the main body 21a. The drawback is the disc-shaped main body 21a has a puffed portion 211a that occupies more height. Moreover, when soldering, the main body 21a cannot lay completely flat on the circuit board (not shown in the figure). Consequently, the main body 21a tends to be pitched, which increases the thickness of the circuit board.

Reference is made to FIG. 1C, which shows the perspective view of the thermistor of the prior art. A thermistor is a resistor whose resistance varies with temperature. The thermistor 30a has a disc-shaped main body 31a and a pair of leads 32a that extend outwards from the main body 31a. The drawback is the disc-shaped main body 31a has a puffed portion 310a that occupies more height. Moreover, when soldering, the main body 31a cannot lay completely flat on the circuit board (not shown in the figure). Consequently, the main body 31a tends to be pitched, which increases the thickness of the circuit board.

Reference is made to FIG. 1D, which shows the perspective view of the varistor of the prior art. The varistor, also called voltage dependent resistor, is used to protect the circuit by diverting excessive voltage away from sensitive components. The varistor 40a has a main body 41a, and a pair of electric leads 42a that extends outwards from the main body 41a. The drawback is the main body 41a is disc-shaped with a puffed portion, which takes up more height. Also when soldering, the main body 41a cannot be fixed completely flat on the circuit board (not shown in the figure). Consequently, the varistor becomes easily pitched, which increases the thickness of the circuit board.

Reference is made to FIG. 1E, which shows the perspective view of the electrolytic capacitor of the prior art. The electrolytic capacitor, or EC-CAP, uses the electrolytic way to form an oxidization film for being a dielectric material for a capacitor. The EC-CAP 50a has a main body 51a, and a pair of leads 52a extending outwards from the main body 51a. The drawback is that the EC-CAP 50a is usually scattered across the circuit board (not shown in the figure). Hence, much circuit board space is occupied. Moreover, the EC-CAP 50a is individually soldered and glued onto the circuit board. The manufacturing process is complex and inefficient.

To address the above issues, the inventor proposed a new integrated circuit board.

SUMMARY OF THE INVENTION

The object of the present invention is to provide an integrated circuit board with reduced total height and overall dimensions.

Another object of the present invention is to provide an integrated circuit board by rearranging the component locations. Instead of random placement, all components are arranged orderly to reduce the total height and overall dimensions. After all the components are in place, the soldering process is performed more efficiently.

In order to achieve the aforementioned objects, according to an embodiment of the present invention, an integrated circuit board is provided. The integrated circuit board includes a bridging filtering capacitor, a bypass capacitor, a thermistor, and a varistor. The bridging filtering capacitor has a rectangular main body with a pair of leads. The main body has the thinnest distance between the upper and lower surface. A pair of straight leads extends outwards from the lower surface. The bypass capacitor has a main body and a pair of electrical leads that extends outwards from the main body. In particular, the main body has a flat upper and lower surface. The thermistor has a main body, a pair of electrical leads and an auxiliary lead that extend outwards from the main body. The main body has a flat upper and lower surface. The varistor has a main body, a pair of electrical leads and an auxiliary lead that extend outwards from the main body. The main body has a flat upper and lower surface.

In order to achieve the second object, according to an embodiment of the present invention, an integrated circuit board is provided. The integrated circuit board includes an electrolytic capacitor set with a plurality of electrolytic capacitors, and a mounting frame. The electrolytic capacitors are arranged in parallel and adjacent to each other. Every electrolytic capacitor has a pair of electric leads extending outwards from one side of the electrolytic capacitor, and an auxiliary lead on the opposite side. The mounting frame is located at one side of the electrolytic capacitors.

The present invention utilizes the above elements to reduce the vertical height, the horizontal width, and the required space. The overall dimension of the integrated circuit board can be reduced to meet the requirements of the electronic devices, such as LCD TVs and screens, etc. By using the auxiliary lead, the glue-spotting process is no longer needed. Most importantly, in conforming to green technology, fewer raw materials are used in making the circuit board.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1A:
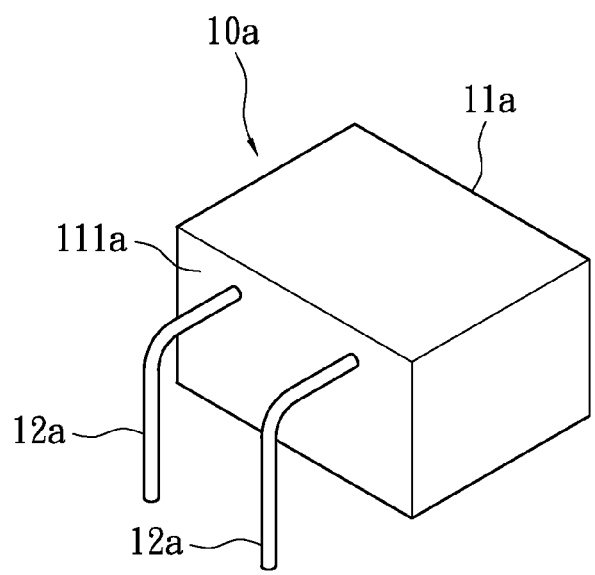
FIG. 1A shows a perspective view of the bridging filtering capacitor of the prior art.
Figure 1B:
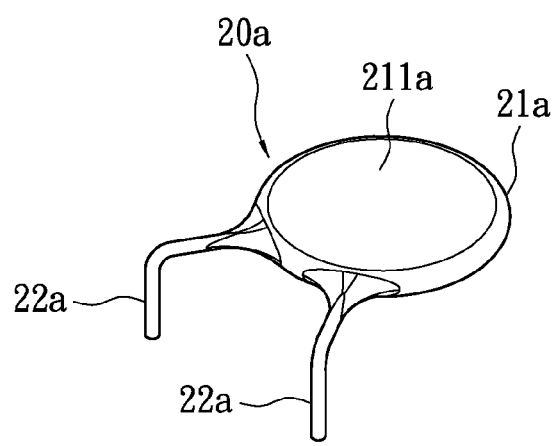
FIG. 1B shows a perspective view of the bypass capacitor of the prior art.
Figure 1D:
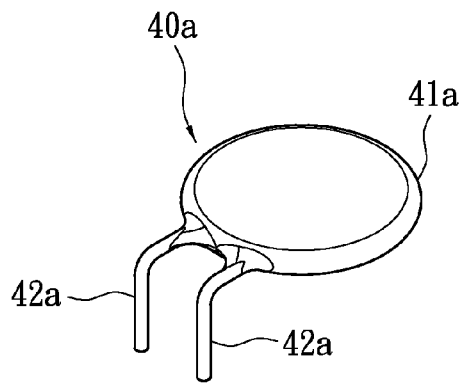
FIG. 1D shows a perspective view of the varistor of the prior art.
Figure 1C:
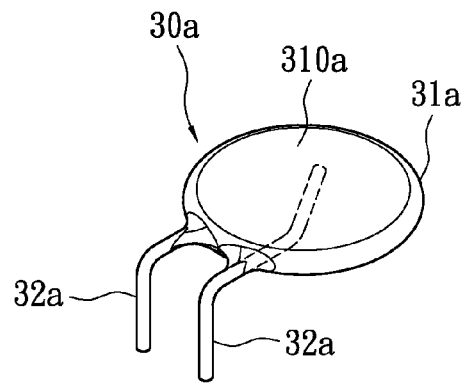
FIG. 1C shows a perspective view of the thermistor of the prior art.
Figure 1E:
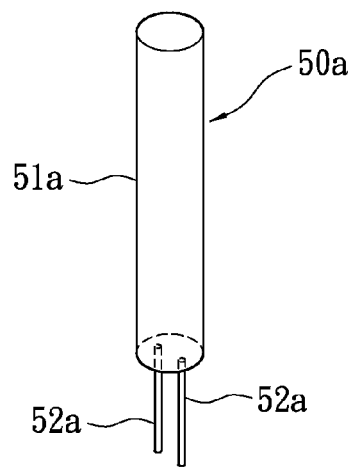
FIG. 1E shows a perspective view of the electrolytic capacitor of the prior art.
Figure 2A:
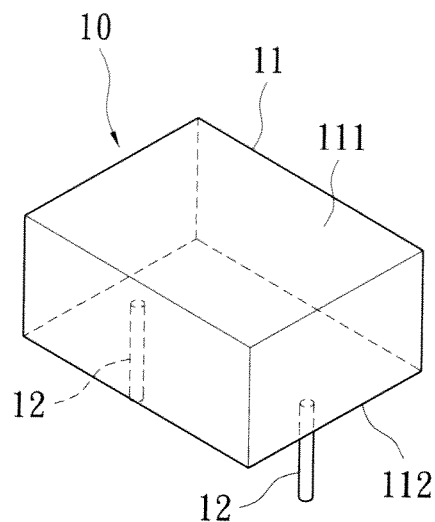
FIG. 2A shows a perspective view of the bridging filtering capacitor of the present invention.

Reference is made to FIGS. 2A to 2E, which show the perspective views of the elements on the integrated circuit board of the present invention. FIG. 2A shows a perspective view of the bridging filtering capacitor of the present invention. The bridging filtering capacitor 10 has a rectangular main body 11, and a pair of electric leads 12. The main body 11 has an upper surface 111 and a lower surface 112 with the thinnest distance in between. In other words, the distance between the upper surface 111 and the lower surface 112 is less than the other two pairs of side surfaces (not labeled in the figure). The pair of electric leads 12 extends downwards from the lower surface 112. Thereby, the required vertical height for the bridging filtering capacitor 10 on the integrated circuit board is reduced. Moreover, the electric leads 12 of the bridging filtering capacitor 10 do not need to extend outwards from the side surface and be bent. Therefore, the required horizontal space for the bridging filtering capacitor 10 on the integrated circuit board 1 (referring to FIG. 3) is reduced.

Figure 2B:
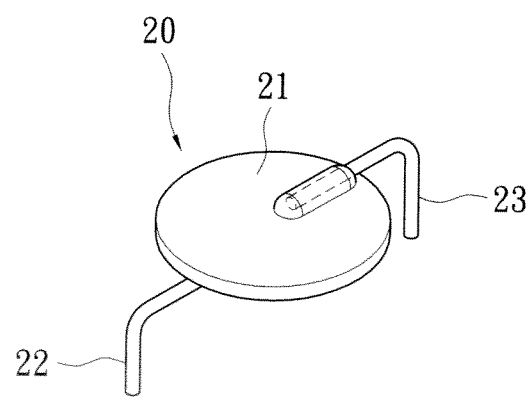
FIG. 2B shows a perspective view of the bypass capacitor of the present invention.

FIG. 2B shows a perspective view of the bypass capacitor of the present invention. The bypass capacitor 20 has a main body 21 and a pair of electric leads 22, 23 extending outwards from the main body 21. The main body 21 is circular and flat, and has a flat upper and lower surface (not labeled). In this embodiment, the electric lead 23 is connected to the upper surface of the main body 21. Because the electric leads 22, 23 of the bypass capacitor 20 extend outwards from opposite sides, the main body 21 lays more flat on the integrated circuit board 1, which prevents the main body 21 from pitching upwards. Thereby, the required vertical height of bypass capacitor 20 on the integrated circuit board 1 is reduced.

Figures 2C, 2D:
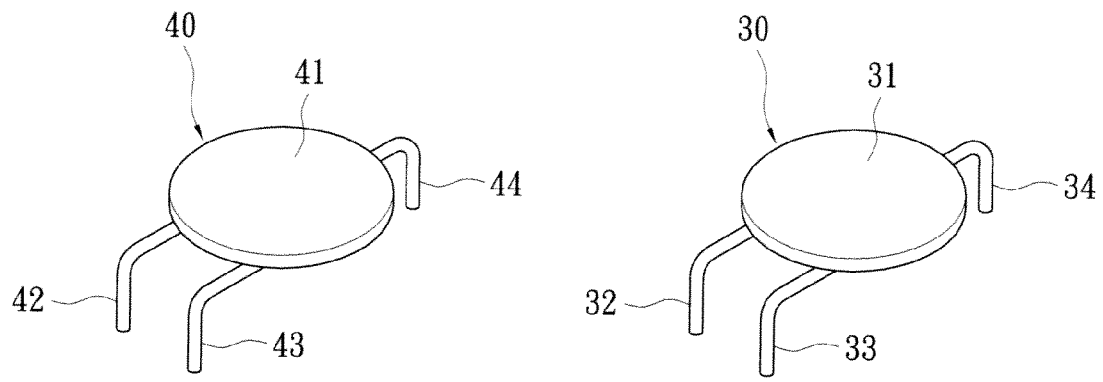
FIG. 2C shows a perspective view of the thermistor of the present invention.
FIG. 2D shows a perspective view of the varistor of the present invention.

FIG. 2C shows a perspective view of the thermistor of the present invention. The thermistor 30 has a main body 31, a pair of electric leads 32, 33 extending outwards from the main body 31, and an auxiliary lead 34, which is opposite to the electric lead 32, 33 and extends outwards from the main body 31. The main body 31 is circular and flat, and has a flat upper and lower surface (not labeled). By utilizing the auxiliary lead 34, the main body 31 of the thermistor 30 lays more flat on the integrated circuit board 1, which prevents the main body 31 from pitching upwards. Thereby, the required vertical height of thermistor 30 on the integrated circuit board 1 is reduced.

FIG. 2D shows a perspective view of the varistor of the present invention. The varistor 40 has a main body 41, a pair of electric leads 42, 43 extending outwards from the main body 41, and an auxiliary lead 44, which is opposite to the electric leads 42, 43 and extends outwards from the main body 41. The main body 41 is circular and flat, and has a flat upper and lower surface (not labeled). By utilizing the auxiliary lead 44, the main body 41 of the varistor 40 lays more flat on the integrated circuit board 1, which prevents the main body 41 from pitching upwards. Thereby, the required vertical height of the varistor 40 on the integrated circuit board 1 is reduced.

Figure 2E:
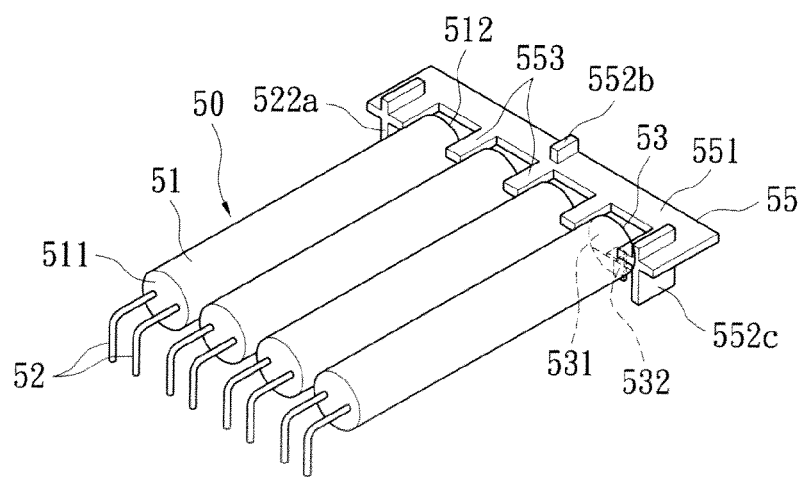
FIG. 2E shows a perspective view of the electrolytic capacitor of the present invention.

FIG. 2E shows a perspective view of the electrolytic capacitor set of the present invention. The integrated circuit board 1 further includes an electrolytic capacitor set 50. The electrolytic capacitor set 50 has a plurality of electrolytic capacitors 51 and a mounting frame 55. The electrolytic capacitors 51 are cylinder-shaped, and each has two side surfaces 511, 512. The electrolytic capacitors 51 are layed in parallel and adjacent to each other. Each electrolytic capacitor 51 has a pair of electric leads 52 that extends outwards from side surface 511. The mounting frame 55 is located at one side of the electrolytic capacitors 51.

In this embodiment, each electrolytic capacitor 51 further has an auxiliary lead 53, which is opposite to the electric leads 52 and is located at the side surface 512 of the electrolytic capacitor 51. The auxiliary lead 53 of the electrolytic capacitor 51 has a connection portion 531 that is attached at the side surface 512 of the electrolytic capacitor 51. The auxiliary lead 53 also has a L-shaped welding portion 532. The welding portion 532 extends outwards from the connection portion 531 and downwards to be soldered onto the integrated circuit board 1.

In one preferred embodiment, the mounting frame 55 is made of plastic, and includes a base 551, a plurality of fixing pieces 552a, 552b, 552c that extend downwards from the base 551 and anchored onto the integrated circuit board 1. The mounting frame 55 also includes a plurality of press rods 553 that extend from the base 551 forward to the electrolytic capacitors 51. Each of the pressing rod 553 presses in between two adjacent electrolytic capacitors 51. By utilizing the mounting frame 55, the electrolytic capacitors 51 can be arranged orderly.

Using the auxiliary lead 53, the electrolytic capacitor 51 lays more flat on the integrated circuit board 1, which prevents the electrolytic capacitor 51 from pitching upwards and disorganized. After soldering, the electrolytic capacitors 51 no longer need the glue-spotting process, which reduces the required manpower. Based on the present invention of the electrolytic capacitors 51, the required vertical height of the integrated circuit board 1 is reduced. Moreover, by arranging the electrolytic capacitors 51 in parallel and next to each other, the occupied space on the integrated circuit board 1 is reduced.

The present invention changes the arrangement of the elements on the integrated circuit board. The electrolytic capacitors 51 are arranged orderly, which reduces the overall height and dimension. Furthermore, the mounting frame 55 is used to group the electrolytic capacitors 51 followed by the soldering process, which simplifies the manufacturing procedures.

Figure 3:
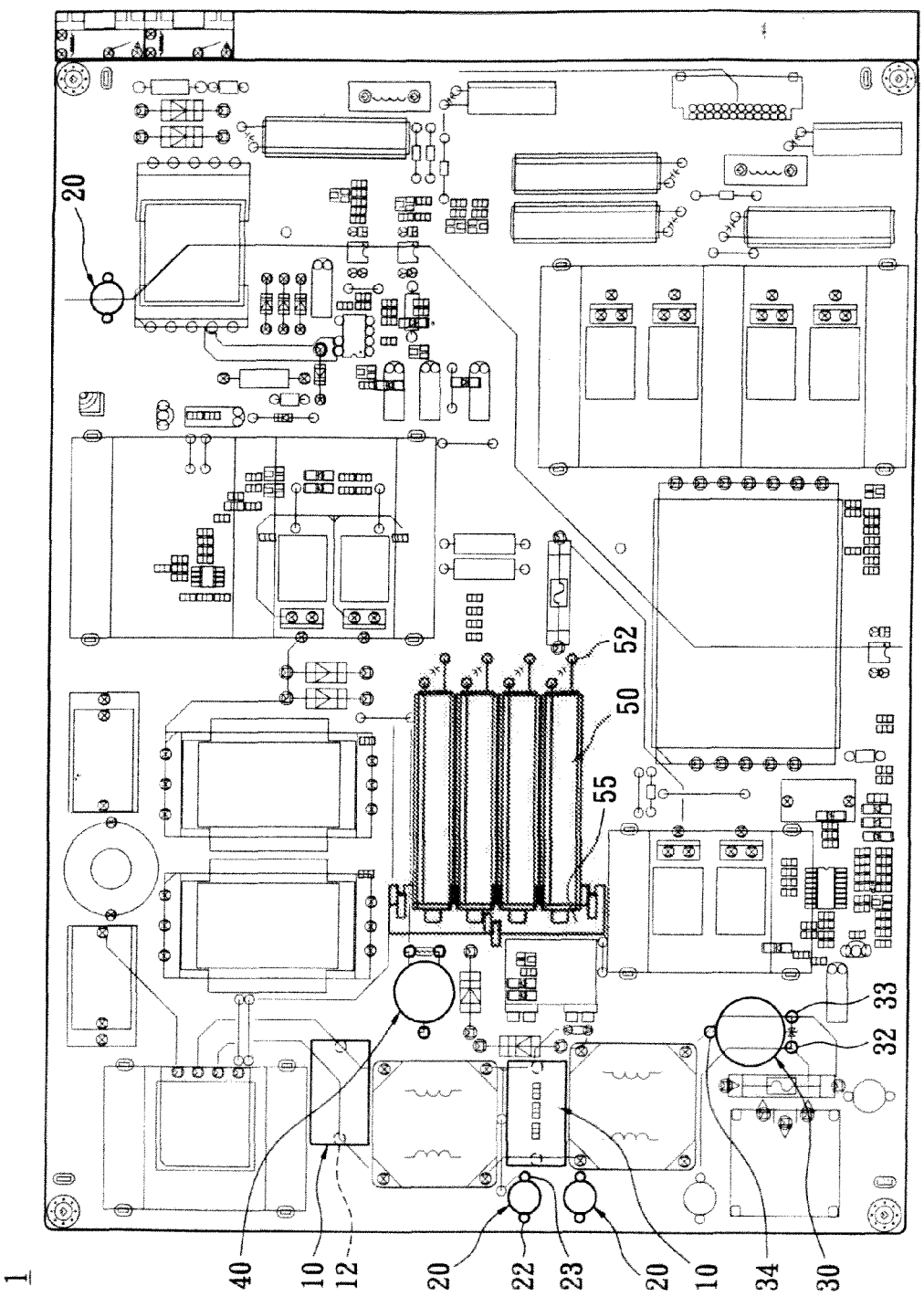
FIG. 3 shows a top view of the integrated circuit board according to an embodiment of the present invention.

Reference is made to FIG. 3, which shows the top view of the integrated circuit board. According to the above contents, the integrated circuit board 1 includes the bridging filtering capacitor 10, the bypass capacitor 20, the thermistor 30, the varistor 40, and the electrolytic capacitor set 50. The present invention uses the above elements to reduce the vertical height, the horizontal width, and the occupied area. Therefore, the overall dimension of the integrated circuit board 1 can be reduced to make the electronic device smaller, especially for thin electronic devices such as LCD TVs and screens. Moreover, the smaller circuit board requires less raw materials in conforming to green technology.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An integrated circuit board, comprising:
    a bridging filtering capacitor having a rectangular main body, and a pair of electric leads, wherein the main body has an upper and a lower surface with a distance in between being smallest versus the other two pairs of side surfaces thereof, and the pair of electric leads extend downward from the lower surface;
    a bypass capacitor having a main body and a pair of electric leads extended outward from the main body, wherein the main body has a flat upper and lower surface;
    a thermistor having a main body, a pair of electric leads that extend outwards from the main body, and an auxiliary lead that is opposite to the pair of electric leads and extends outwards from the main body, wherein the main body has a flat upper and lower surface; and
    a varistor having a main body, a pair of electric leads that extend outwards from the main body, and an auxiliary lead that is opposite to the pair of electric leads and extends outwards from the main body, wherein the main body has a flat upper and lower surface.

2. The integrated circuit board according to claim 1, wherein the main body of the bypass capacitor, the main body of the thermistor, and the main body of the varistor are circular and flat.

3. The integrated circuit board according to claim 1, further comprising an electrolytic capacitor set, wherein the electrolytic capacitor set comprises:
    a plurality of electrolytic capacitors arranged in parallel and adjacent to each other, wherein each electrolytic capacitor has a pair of electric leads that extend outwards from one side; and
    a mounting frame located at one side of the electrolytic capacitors.

4. The integrated circuit board according to claim 3, wherein the electrolytic capacitor is cylinder-shaped, and each electrolytic capacitor has an auxiliary lead on the opposite side of the pair of electric leads.

5. The integrated circuit board according to claim 4, wherein the auxiliary lead of the electrolytic capacitor has a connection portion, and a soldering portion that extends outwards from the connection portion and downwards to be soldered onto the circuit board.

6. The integrated circuit board according to claim 3, wherein the mounting frame has a base, a plurality of fixing pieces that extend downwards from the base and anchor onto the circuit board, and a plurality of pressing rods that extend forwards from the base to the electrolytic capacitors, and each pressing rod presses in between two electrolytic capacitors.

* * * * *